United States Patent [19]
Au et al.

[11] Patent Number: 5,789,953
[45] Date of Patent: Aug. 4, 1998

[54] CLOCK SIGNAL GENERATOR PROVIDING NON-INTEGER FREQUENCY MULTIPLICATION

[75] Inventors: Mario F. Au, Fremont; Eugene D. Wang, Santa Clara, both of Calif.

[73] Assignee: Integrated Device Technology, Inc., Santa Clara, Calif.

[21] Appl. No.: 655,344

[22] Filed: May 29, 1996

[51] Int. Cl.[6] .............................. H02M 5/40; H03K 3/78
[52] U.S. Cl. .................. 327/116; 327/113; 327/114; 327/122; 327/170; 377/48; 331/57
[58] Field of Search ..................... 327/113, 114, 327/115, 116, 117, 119, 198, 199, 200, 217, 218, 170, 100; 377/47, 48; 331/57

[56] References Cited

U.S. PATENT DOCUMENTS

| | | | |
|---|---|---|---|
| 3,922,593 | 11/1975 | McGuffin et al. | 327/116 |
| 5,325,487 | 6/1994 | Au et al. | 395/250 |
| 5,644,259 | 7/1997 | Shishikura et al. | 327/143 |

FOREIGN PATENT DOCUMENTS

| | | | |
|---|---|---|---|
| 354051767A | 4/1979 | Japan | 327/116 |

OTHER PUBLICATIONS

S. Roach, "Digital High Frequnecy Doubler Circuit," IBM Technical Disclosure Bulletin, vol. 25, No. 3A, Aug. 1982, pp. 1146–1147.

*Primary Examiner*—Timothy P. Callahan
*Assistant Examiner*—Dinh Le
*Attorney, Agent, or Firm*—Skjerven,Morrill,MacPherson,Franklin & Friel

[57] ABSTRACT

A clock signal generator or frequency multiplier generates an output signal having a frequency which is a non-integer multiple of an input signal frequency. One clock signal generator contains one or more shift registers. A signal generated from a logical combination of bits from the shift registers transitions from high to low or low to high as values in the shift registers shift. The transitions have a pattern which repeats each time values in the shift registers return to their initial states and the initial states stored in the shift registers control the number of transitions per repetition. The frequency of the combined signal is the frequency of the input signal times the ratio of the number of transitions per repetition to the number of shifts per repetition. One embodiment of the invention provides a 1.33x multiple of an input clock signal. Using a 1.33x multiple of a nominally highest frequency input clock signal from a set of input clock signals provides an output clock signal having a frequency greater than any input clock signal in the set even if the frequencies of the input clock signals vary from their nominal frequencies by up to 10%.

21 Claims, 5 Drawing Sheets

CLOCK SIGNAL GENERATOR PROVIDING NON-INTEGER FREQUENCY MULTIPLICATION

BACKGROUND OF THE INVENTION

1. Field of the Invention

This invention relates to frequency multipliers, clock signal generators, and generating a signal having a frequency which is a non-integer multiple of the frequency of an input signal.

2. Description of Related Art

Many circuits require an internal clock signal which is related to but not necessarily equal to a clock signal input to the circuit. One example of such circuits is a first-in first-out (FIFO) buffer. FIFO buffers mediate asynchronous data transfers between devices which have independent clock signals. A typical FIFO buffer has at least two data ports which connect to external devices and receive clock signals from the external devices to control timing of data transfers through the data ports. FIFO buffers also contain memory and control circuitry for storing data and updating read pointers, write pointers, and flag signals. Some FIFO buffers require an internal clock signal which has a frequency greater than or equal to the highest frequency of the clock signals from the data ports. The internal clock signal may be required, for example, when generating a flag signal that must be updated within a fixed number of clock cycles of the fastest device.

In an application of a FIFO buffer, the user can determine which device connected to the FIFO buffer has the higher frequency clock signal and can configure the FIFO buffer to select the higher frequency clock signal as the internal clock signal. However, if the frequencies of two input clock signals are nominally the same or very close to each other, the actual frequencies may drift so that the device with the nominally lower frequency clock signal actually operates at a higher frequency. On such occasions, the FIFO buffer can fail.

A frequency doubler which doubles the nominally faster input clock signal's frequency could generate an internal clock signal which is sure to have a higher frequency than either input clock signal even if the nominally lower frequency has drifted up significantly and/or the nominally higher frequency has drifted down significantly. However, a frequency doubler provides an internal clock signal that is about twice as fast as actually required. Making circuitry fast enough to use a doubled frequency clock increases the cost of the FIFO buffer, and often the speed of the circuitry which uses the internal clock signal limits the maximum usable device frequency.

SUMMARY OF THE INVENTION

In accordance with the invention, a clock generator produces an output clock signal with a frequency that is a non-integer multiple of an input clock signal frequency. In applications such as a first-in first-out (FIFO) buffer, a 1.33x clock generator generates an output clock signal having a frequency which is about 33% higher than the frequency of an input clock signal. The output frequency being 33% higher is useful because if the input clock signal has a nominal frequency which is greater than or equal to the nominal frequency of the other input clock signal, the frequency of the output clock signal is ensured to be the highest even if the frequencies of both input clock signals fluctuate by as much as 10% from their nominal values.

In accordance with one embodiment of the invention, a clock generator circuit includes first and second shift registers which shift stored values at the frequency of an input clock signal. Selected bits in the shift registers provide output signals that repeat each time values in the shift registers return to their initial positions. For example, an output signal from a 1-bit storage element in a shift register repeats once every N cycles of the input clock signal where N is the number of bits in the shift register. Combination logic coupled to the shift registers combines output signals from the shift registers to generate a combined signal which has transitions at selected edges of the output signals from the shift registers. The operation performed by the combination logic, the timing of shifts, and the values stored in the shift registers determine when transitions in the combined signal occur. Shifting one shift register out of phase with shifting of the other shift register can provide more edges for selection as transitions in the combined signal. This allows the combination logic to provide a combined signal having a more uniform frequency signal and a duty cycle closer to 50%. If the combined signal repeats every N cycles (as do the output signals from the shift register) and if the number of high-to-low transitions in each repetition of the combined signal is T, the combined signal has an average frequency which is T/N times the input clock signal. The combined signal can then be filtered to change the duty cycle or subjected to further frequency multiplication or division.

BRIEF DESCRIPTION OF THE DRAWINGS

Use of the same reference symbols in different figures indicates similar or identical items.

DETAILED DESCRIPTION OF THE PREFERRED EMBODIMENTS

Figure 1:
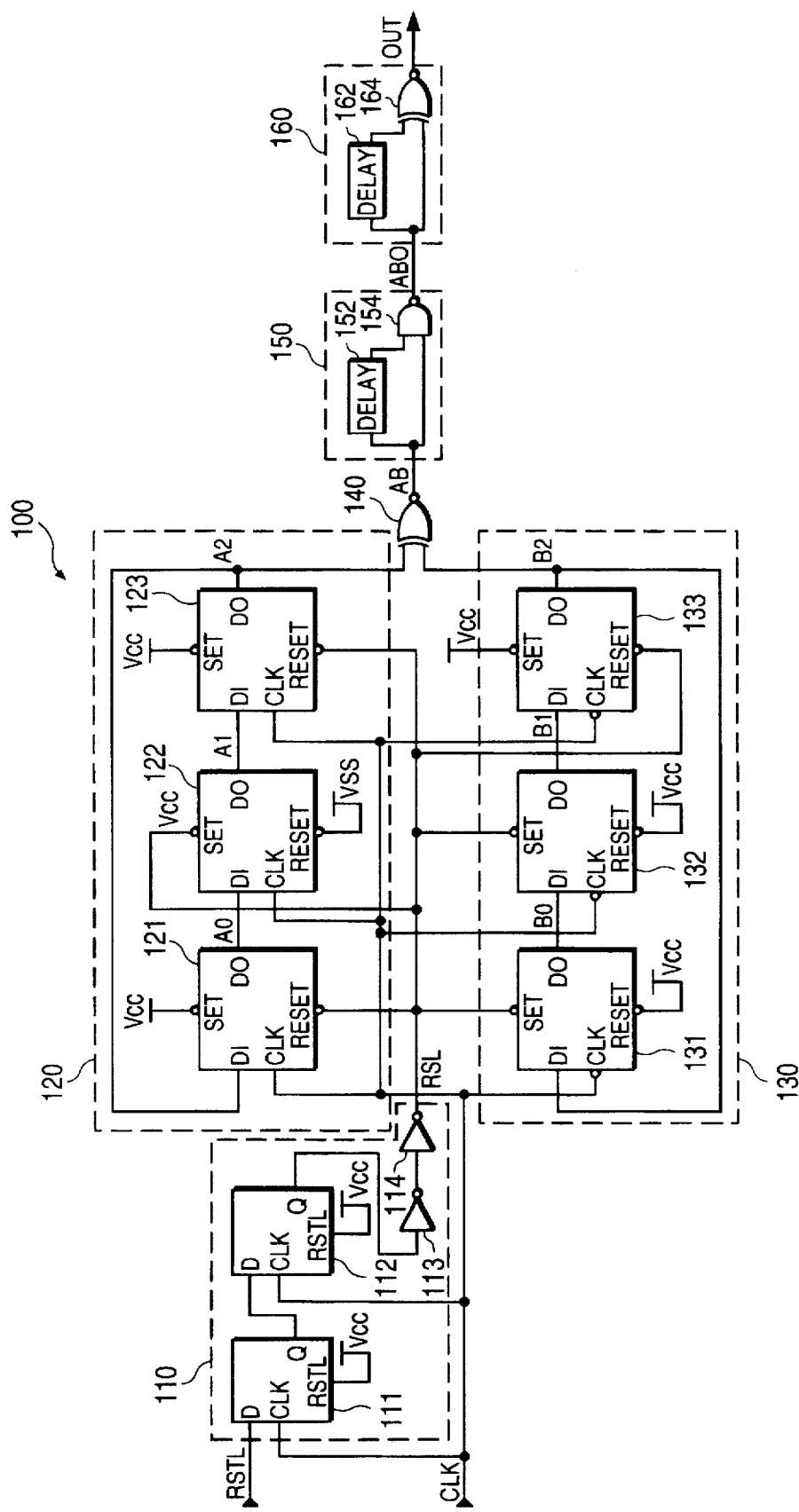
FIG. 1 shows a circuit diagram of a 1.33x clock generator in accordance with an embodiment of the invention.

FIG. 1 shows a clock generator or frequency multiplier 100 in accordance with an embodiment of the invention. Clock generator 100 contains two shift registers 120 and 130 which generate respective signals A2 and B2. Each signal A2 and B2 indicates a value from a storage location in respective shift registers 120 and 130 and repeats every three cycles of an input clock signal CLK. An exclusive NOR gate 140 combines signals A2 and B2 to generate a signal AB that has a frequency which is a non-integer multiple of input clock signal CLK. In particular, signal AB transitions low to high (or high to low) twice during each set of three clock cycles and has an average frequency which is two thirds the frequency of clock signal CLK. As described more fully below, shift registers 120 and 130 are initialized with values that shift registers 120 and 130 shift to create patterns in signals A2 and B2 and produce the desired transitions in signal AB. A filter 150 and a frequency doubler 160 convert signal AB into an output clock signal OUT having a frequency which is about 1.33 (or 4/3) times the frequency of input clock signal CLK.

In clock generator 100, shift registers 120 and 130 respectively contain flip-flops 121 to 123 and flip-flops 131 to 133 which are connected to form rings. In shift register 120, flip-flop 121 provides to flip-flop 122 an input data bit indicated by a signal A0, flip-flop 122 provides to flip-flop 123 an input data bit indicated by a signal A1, and flip-flop 123 provides to flip-flop 121 an input data bit indicated by signal A2. Flip-flops 121 to 123 are positive edge triggered so that at each positive (or rising) edge of input clock signal CLK, data bits stored in flip-flops 121 to 123 shift to the next flip-flop in the cyclic order of shift register 120. Shift register 130 operates in a similar manner except that flip-flops 131 to 133 are negative edge triggered. At each negative (or falling) edge of input clock signal CLK, flip-flop 131 provides to flip-flop 132 a data bit indicated by a signal B0; flip-flop 132 provides to flip-flop 133 a data bit indicated by a signal B1; and flip-flop 133 provides to flip-flop 131 a data bit indicated by signal B2. The difference in triggering of flip-flops 123 and 133 ensures that transitions in signal A2 do not occur at the same time as transitions in signal B2.

Reset circuitry 110 initializes values in shift registers 120 and 130 by either setting or resetting each of flip-flops 121 to 123 and 131 to 133 in response to a reset signal RSTL being asserted low. Flip-flops 111 and 112 and inverters 113 and 114 in reset circuit 110 filter glitches from reset signal RSTL and delay asserting an internal reset signal RSL for two cycles of input clock signal CLK. When signal RSL is asserted (low), flip-flops 121, 123, and 133 are reset (i.e. store value 0), and flip-flops 122, 131, and 132 are set (i.e. store value 1). When signal RSL is deasserted, the values in shift registers 120 and 130 shift each cycle of signal CLK.

Exclusive NOR gate 140, which may be formed by an exclusive OR gate followed by an inverter, combines signals A2 and B2 to generate signal AB which is low if and only if exactly one of signals A2 and B2 is low. Signal AB has a pattern that repeats itself every three cycles of input clock signal CLK because in three clock cycles values in each of shift registers 120 and 130 return to their initial states. Two high-to-low transitions during the three clock cycles result from storing initial values 010b and 110b in shift registers 120 and 130, respectively. Table 1 shows signals CLK, A0, A1, A2, B0, B1, B2, and AB during three cycles of signal CLK. After three cycles, the pattern shown in Table 1 repeats.

TABLE 1

| CLK | A0 | A1 | A2 | B0 | B1 | B2 | AB |
|---|---|---|---|---|---|---|---|
| 1 | 0 | 1 | 0 | 1 | 1 | 0 | 1 |
| 0 | 0 | 1 | 0 | 0 | 1 | 1 | 0 |
| 1 | 0 | 0 | 1 | 0 | 1 | 1 | 1 |
| 0 | 0 | 0 | 1 | 1 | 0 | 1 | 1 |
| 1 | 1 | 0 | 0 | 1 | 0 | 1 | 0 |
| 0 | 1 | 0 | 0 | 1 | 1 | 0 | 1 |

As shown in Table 1, signal AB remains low for the time between a high-to-low transition in signal CLK and the following low-to-high transition. (Signal AB is low for half a cycle of signal CLK if signal CLK has a 50% duty cycle.) Signal AB remains high for a full clock cycle at a time. Filter 150 shapes signal AB to provide a signal ABO having a duty cycle closer to 50%. In filter 150, signal AB is applied directly to one input terminal of a NAND gate 154 and applied through a delay 152 to the second input of NAND gate 154. Signal ABO which is output from NAND gate 154 is high when signal AB is low. When signal AB transitions from low to high, signal ABO remains high for a delay time required for signal AB to propagate through delay 152. Accordingly, the periods in signal ABO corresponding to signal AB being low are thus extended by the delay time of delay 152.

Delays such as delay 152 are well known and may be, for example, a set of inverters connected in series. Suitable delay times for delay 152 depend on the frequency and duty cycle (i.e. the percentage of time that a signal is high) of signal CLK and the desired duty cycle and frequency of signal ABO. In an embodiment where signal CLK has a frequency of about 100 MHz and a duty cycle of between 40% and 60%, a suitable delay time for delay 152 is about 3 nanoseconds. Alternatively, delay 152 can have a user set delay time that is programmable for a variety of input clock frequencies.

Frequency doubler 160 converts signal ABO to clock signal OUT which has twice the frequency of signal ABO or about 1.33 times the frequency of signal CLK. In frequency doubler 160, signal ABO is applied to a first input terminal of an exclusive NOR gate 160 and applied through a delay 162 to a second input terminal of exclusive NOR gate 164. Each time signal ABO transitions low to high or high to low, input voltages to exclusive NOR gate 164 are different for the delay time required for the new state of signal ABO to propagate through delay 164, and signal OUT is low during the delay time associated with each transition. If the delay time of delay 162 is less than the time between transitions in signal ABO, each transition in signal ABO creates a pulse in signal OUT, and signal OUT has twice the frequency of signal ABO. In an embodiment suited for signal CLK having a frequency of about 100 MHz, delay 162 has a delay time of about 3 nanoseconds.

Figure 2:
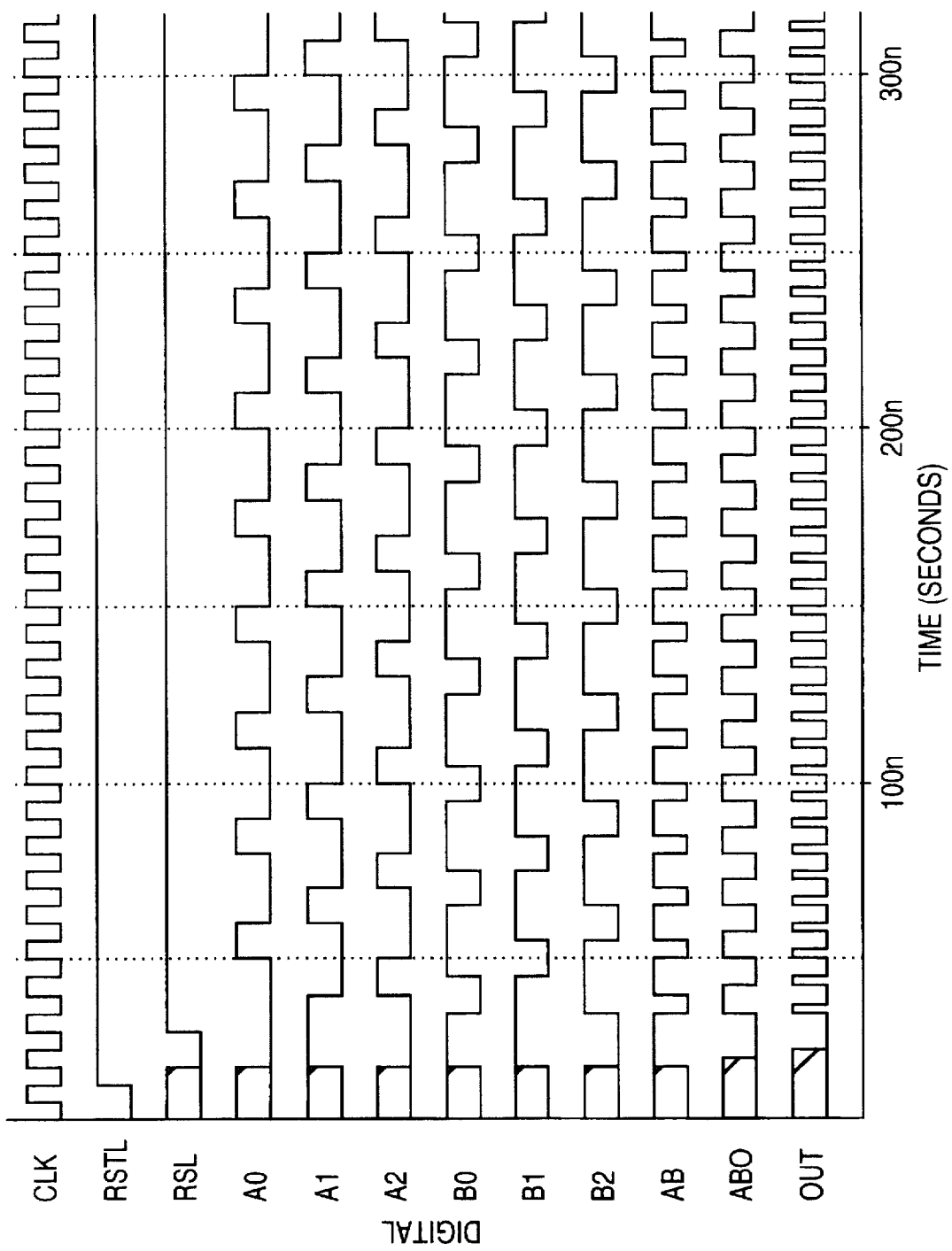
FIGS. 2, 3, and 4 show timing diagrams for signals which the clock generator of FIG. 1 generates from input signals having 50%, 40%, and 60% duty cycles.

FIG. 2 shows a timing diagram for signals generated in clock generator 100 when input clock signal CLK has a frequency of 100 MHz and a 50% duty cycle. External reset signal RSTL is initially asserted low and then deasserted high causing a pulse in internal reset signal RSL that sets respective initial values 010b and 110b in shift registers 120 and 130. Signals A0, A1, and A2 and B0, B1, and B2 begin oscillating when signal RSL is deasserted. Signals A0, A1, and A2 have about a 33% duty cycle and a frequency which is one third the frequency of signal CLK. Signals B0, B1, and B2 also have a frequency which is one third the frequency of signal CLK but have about a 66% duty cycle. Signal AB is generated from signals A2 and B2 and is low if and only if exactly one of signals A2 and B2 is low. The duty cycle of signal AB depends on the relative phase of signals A2 and B2 which in turn depends on the duty cycle of input clock signal CLK because signal A2 transitions on positive edges of signal CLK and signal B2 transitions on negative edges of signal CLK. Signal ABO is shaped by expanding a portion of each cycle so that each transition is farther apart than the delay time of delay 162 ensuring that frequency doubler 160 can operate properly.

Figure 3:
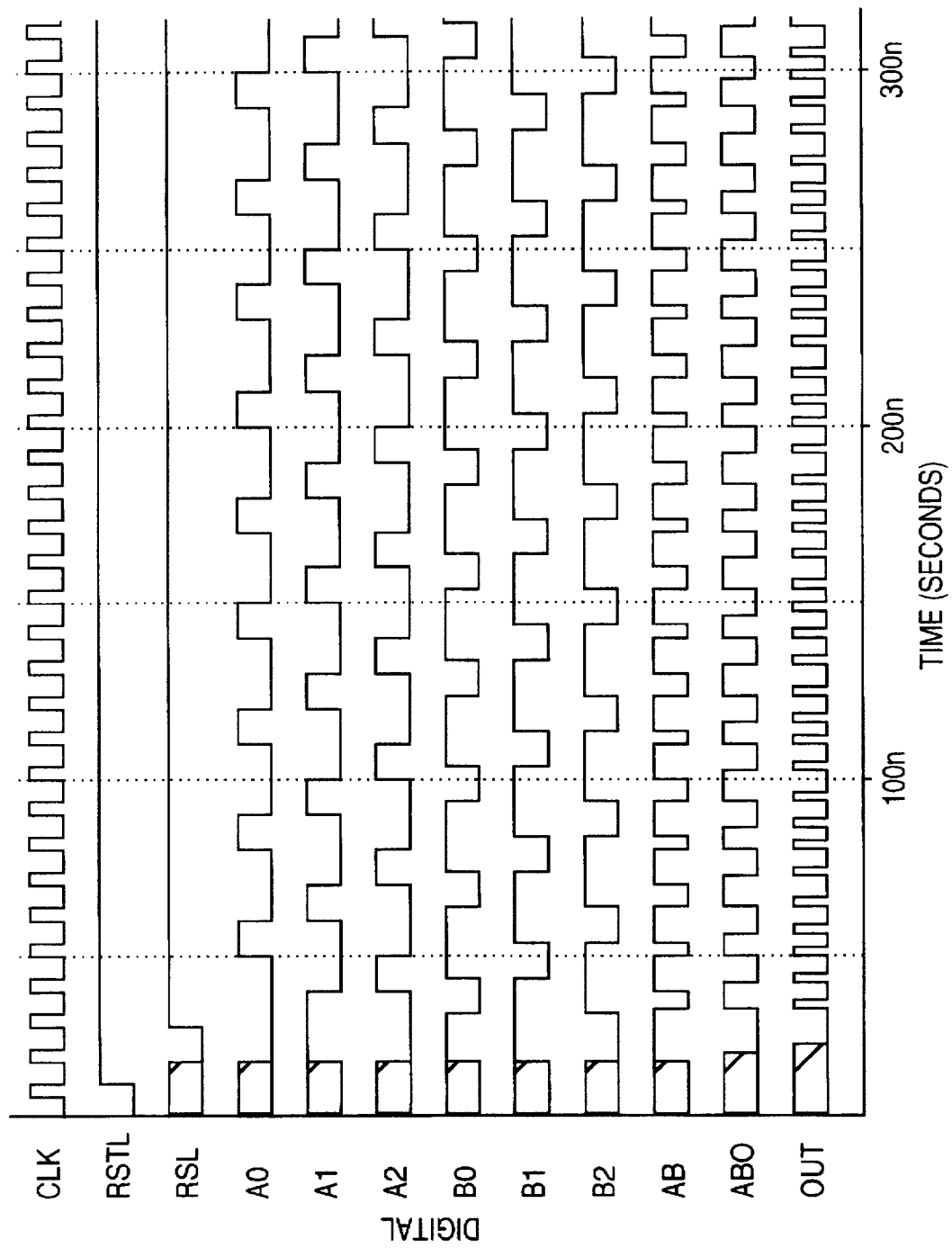
Figure 4:
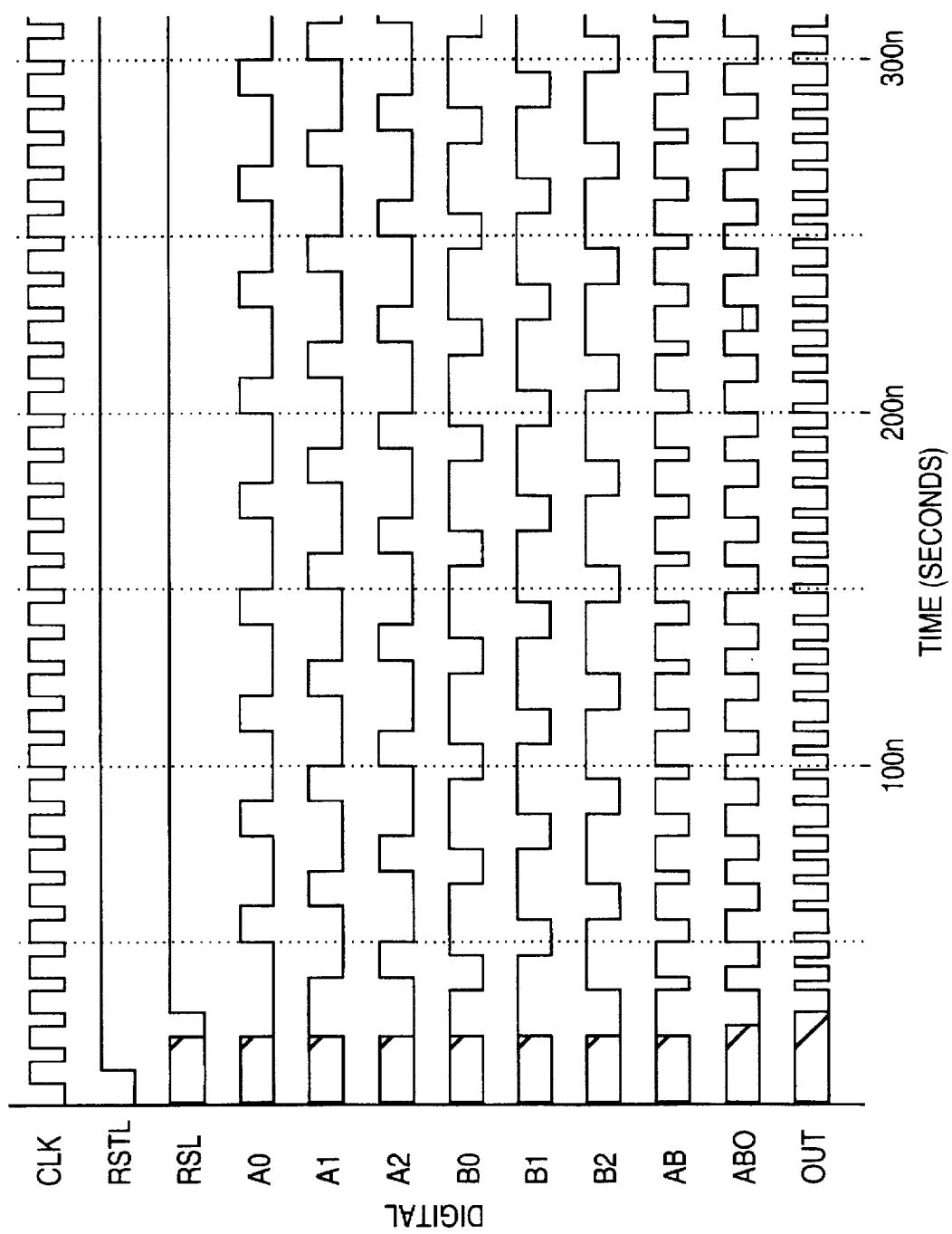

FIGS. 3 and 4 show the same signals as those shown in FIG. 2 for cases where signal CLK has 40% and 60% duty cycles. The resulting output clock signal OUT in each case has an average frequency of about 133 MHz or about 1.33 times the frequency of input clock signal CLK. The different duty cycles for clock signal CLK cause jitter in signal OUT because changing the duty cycle changes the locations of edges selected for signal AB. However, the jitter in frequency is relatively small (less than 10%) and acceptable for most applications.

Figure 5:
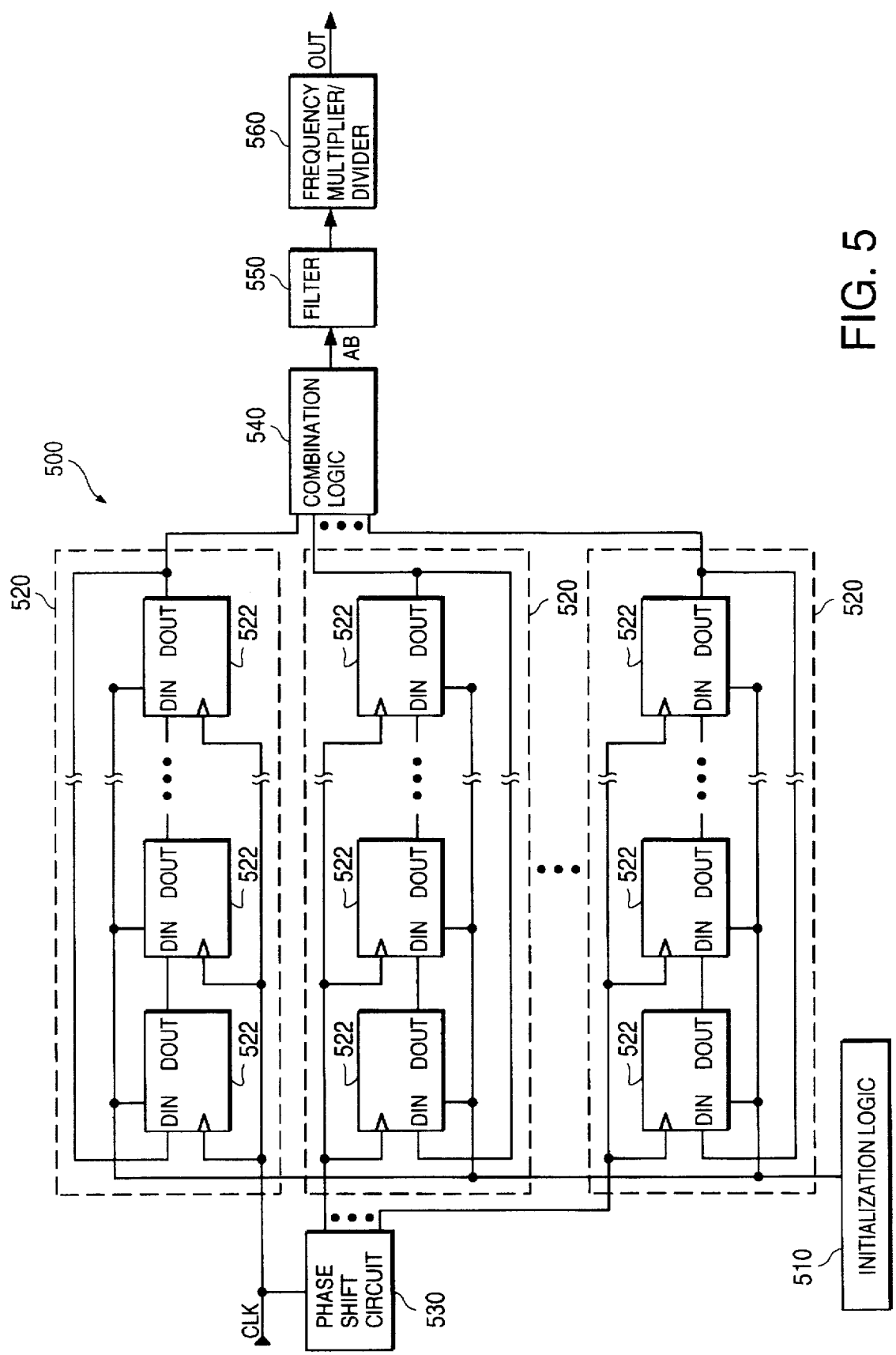
FIG. 5 shows a block diagram of a clock generator in accordance with another embodiment of the invention.

FIG. 5 shows a clock generator 500 which includes multiple shift registers 520. Each shift register 520 contains 1-bit storage elements 522 connected into a ring. Each shift register 520 may have the same size (i.e. number of storage elements) or can differ in size. In an alterative embodiment, shift registers 520 are replaced with any type of circuit capable of providing a cyclic signal having a programmable duty cycle and a frequency which is a fraction of the frequency of input clock signal CLK. Combination logic 540 combines output signals from shift registers 520 to generate a signal AB having a frequency related to the sizes and the values in shift registers 520. In one particular embodiment, signal AB has an average frequency which is equal to T/N times the frequency of signal CLK where N is the number cycles required before output signals from shift registers 520 repeat and T is the number of high-to-low (or low-to-high) transitions that combination logic 540 generates during N cycles.

To provide more edges which combination logic 540 can select for signal AB, phase shift circuit 530 controls shifting to keep output signals from shift registers 520 out of phase with each other. In an embodiment containing two shift registers, phase shift circuit 530 can be an inverter which triggers one shift register on positive edges of signal CLK and another shift register on negative edges of signal CLK. Alternatively, phase shift circuit 530 can contain a delay circuit and provide signal CLK directly to one shift register 520 and a delayed version of the clock signal CLK to another shift register 520. An advantage of providing a delayed rather than an inverted clock signal is that all shift registers 520 can be triggered by the same edges (delayed or otherwise) of signal CLK. This makes output signals from shift registers 520 and signal AB independent of the duty cycle of signal CLK. Additionally, a different delayed clock signal can be generated for each shift register 520.

Initialization logic 510 provides initial values which when shifted and combined create the transitions in signal AB. The initial values and the timing of shifts in shift registers 520 control the number and timing of the transitions. Suitable initial values are therefore selected according to the desired frequency and duty cycle of signal AB. Signal AB can be used directly or can be filtered by an optional filter 550 and/or adjusted in frequency by an optional frequency multiplier or divider 560.

Although the present invention has been described with reference to particular embodiments, the description is only an example of the invention's application and should not be taken as a limitation. In particular, much of the preceding discussion was aimed at a 1.33x frequency multiplier which when applied to a nominally highest frequency signal in a group of signals generates a clock signal having a frequency greater than the frequency of any signal in the group even if the each signal in the group has a frequency that can vary by ±10%. Alternative embodiments of this invention are not limited to 1.33x frequency multipliers. Various other adaptations and combinations of features of the embodiments disclosed are within the scope of the present invention as defined by the following claims.

We claim:

1. A clock generator, comprising:

a first shift register that generates a first signal representing a bit from a first value stored in the first shift register, wherein the first value includes multiple bits and in response to a first trigger signal that is a positive edge of an input clock signal, the first shift register changes which bit of the first value the first signal represents;

a second shift register that generates a second signal representing a bit from a second value stored in the second shift register, wherein the second value includes multiple bits and in response to a second trigger signal that is a negative edge of the input clock signal, the second shift register changes which bit of the second value the second signal represents; and combination logic coupled to the first and second shift registers, wherein the combination logic generates an output clock signal that is a logical combination of the first and second signals.

2. The clock generator of claim 1, wherein:

the first shift register comprises a plurality of positive-edge-triggered storage elements connected to form a first ring; and the second shift register comprises a plurality of negative-edge-triggered storage elements connected to form a second ring.

3. A clock generator comprising:

a first shift register that generates a first signal representing a bit from a first value stored in the first shift register, wherein the first value includes multiple bits and in response to a first trigger signal, the first shift register changes which bit of the first value the first signal represents;

a second shift register that generates a second signal representing a bit from a second value stored in the second shift register, wherein the second value includes multiple bits and in response to a second trigger signal, the second shift register changes which bit of the second value the second signal represents;

combination logic coupled to the first and second shift registers, wherein the combination logic generates an output clock signal that is a logical combination of the first and second signals; and a phase shift circuit which generates the first and second trigger signals from an input clock signal.

4. The clock generator of claim 3, wherein the phase shift circuit provides the input clock signal as the first trigger signal and inverts the input clock signal to generate the second trigger signal.

5. The clock generator of claim 3, wherein the phase shift circuit comprises a delay circuit which delays the second trigger signal relative to the first trigger signal.

6. A clock generator comprising:

a first shift register that generates a first signal representing a bit from a first value stored in the first shift register, wherein the first value includes multiple bits and in response to a first trigger signal, the first shift register changes which bit of the first value the first signal represents;

a second shift register that generates a second signal representing a bit from a second value stored in the second shift register, wherein the second value includes multiple bits and in response to a second trigger signal, the second shift register changes which bit of the second value the second signal represents;

combination logic coupled to the first and second shift registers, wherein the combination logic generates an output clock signal that is a logical combination of the first and second signals; and an initialization circuit that initializes the first value by writing to the first shift register and initializes the second value by writing to the second shift register.

7. A clock generator comprising:

a first shift register that generates a first signal representing a bit from a first value stored in the first shift register, wherein the first value includes multiple bits and in response to a first trigger signal, the first shift register changes which bit of the first value the first signal represents;

a second shift register that generates a second signal representing a bit from a second value stored in the second shift register, wherein the second value includes multiple bits and in response to a second trigger signal, the second shift register changes which bit of the second value the second signal represents;

combination logic coupled to the first and second shift registers, wherein the combination logic generates an output clock signal that is a logical combination of the first and second signals; and a filter coupled to the combination logic to shape the output clock signal.

8. The clock generator of claim 7, further comprising a frequency multiplier coupled to change the frequency of the output clock signal.

9. A clock generator comprising:

a first shift register that generates a first signal representing a bit from a first value stored in the first shift register, wherein the first value includes multiple bits and in response to a first trigger signal, the first shift register changes which bit of the first value the first signal represents;

a second shift register that generates a second signal representing a bit from a second value stored in the second shift register, wherein the second value includes multiple bits and in response to a second trigger signal, the second shift changes which bit of the second value the second signal represents;

a third shift register that generates a third signal representing a bit from a third value stored in the third shift register, wherein the third value includes multiples bits and in response to a third trigger signal, the third shift register changes which bit of the third value the third signal represents; and combination logic coupled to the first, second, and third shift registers, wherein the combination logic generates an output clock signal that is a logical combination of the first, second, and third signals.

10. A clock generator comprising:

a first ring of storage elements, each storage element having a data input terminal and a data output terminal, wherein the data input terminal of each storage element is connected to the data output terminal of a preceding storage element in the first ring, and a first clock signal controls when each storage element in the first ring loads a value represented by a signal on the storage element's data input terminal;

a second ring of storage elements, each storage element in the second ring having a data input terminal and a data output terminal, wherein the data input terminal of each storage element is connected to the data output terminal of a preceding storage element in the second ring, and the first clock signal controls when each storage element in the second ring stores a value represented by a signal on the storage element's data input terminal; and combination logic having a first input terminal coupled to the data output terminal of one of the storage elements in the first ring and a second input terminal coupled to the data output terminal of one of the storage elements in the second ring, the combination logic generating a second clock signal having a frequency which is a non-integer multiple of the first clock signal.

11. The clock generator of claim 10, wherein:

the first ring comprises a first storage element, a second storage element, and a third storage element, the data output terminal of the first storage element being coupled to the data input terminal of the second storage element, the data output terminal of the second storage element being coupled to that data input terminal of the third storage element, and the data output terminal of the third storage element being coupled to the data input terminal of the first storage element; and the second ring comprises a fourth storage element, a fifth storage element, and a sixth storage element, wherein a data output terminal of the fourth storage element is coupled to a data input terminal of the fifth storage element, a data output terminal of the fifth storage element is coupled to a data input terminal of the sixth storage element, and a data output terminal of the sixth storage element is coupled to a data input terminal of the fourth storage element.

12. The clock generator of claim 11, further comprising initialization logic coupled to set the second, fourth, and fifth storage elements and reset the first, third, and sixth storage elements.

13. The clock generator of claim 12, wherein the combination logic comprises an exclusive OR gate and the first and second input terminals of the combination logic are input terminals of the exclusive OR gate.

14. The clock generator of claim 13, wherein the combination logic further comprises an inverter coupled to an output terminal of the exclusive OR gate.

15. The clock generator of claim 10, wherein each storage element in the first ring comprises a positive-edge-triggered flip-flop, and each storage element in the second ring comprises a negative-edge-triggered flip-flop.

16. The clock generator of claim 10, wherein the second clock signal has a frequency that is approximately 1.33 times the frequency of the first clock signal.

17. A method for generating an output clock signal from an input clock signal, the method comprising:

storing a first value in a first shift register;

storing a second value in a second shift register;

periodically shifting the first value in the first shift register, wherein shifting of the first value is at a rate controlled by the input clock signal;

periodically shifting the second value in the second shift register, wherein shifting of the second value is at a rate controlled by the input clock signal and is not simultaneous with shifting of the first value in the first shift register; and generating the output clock signal from a logical combination of a first signal from the first shift register and second signal from the second shift register.

18. The method of claim 17, wherein periodically shifting the first value comprises shifting at positive edges of the input clock signal and periodically shifting the second value comprises shifting at negative edges of the input clock signal.

19. A method for generating an output clock signal having a frequency that is greater than any of a plurality of frequencies for a plurality of input clock signals, the method comprising:

selecting from the plurality of input clock signals a first input clock signal that has a nominal frequency that is greater than or equal to each nominal frequency in a set of nominal frequencies associated with the plurality of input clock signals; and applying the first input clock signal to a frequency multiplier to generate the output clock signal, wherein the frequency of the output clock signal is equal to a non-integer multiple of the frequency of the first input clock signal.

20. The method of claim 19, wherein for each of the input clock signals, the frequency of that input clock signal fluctuates about the nominal frequency associated with the input clock signal, and the non-integer multiple is greater than 1 plus a largest fractional difference between the frequency and the nominal frequency for any of the input clock signals.

21. The method of claim 19, wherein the non-integer multiple is about 1.33.

* * * * *